(12) United States Patent
Fourches

(10) Patent No.: US 7,936,018 B2
(45) Date of Patent: May 3, 2011

(54) SEMICONDUCTOR DEVICE

(75) Inventor: Nicolas Fourches, Les Ulis (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/640,565

(22) Filed: Dec. 17, 2009

(65) Prior Publication Data

US 2010/0155806 A1  Jun. 24, 2010

(30) Foreign Application Priority Data

Dec. 18, 2008  (FR) ..................... 08 58811

(51) Int. Cl.
*H01L 27/01* (2006.01)

(52) U.S. Cl. .. 257/347; 257/315; 257/239; 257/E21.334

(58) Field of Classification Search .......... 257/314–315, 257/239, 261, 347–354
See application file for complete search history.

(56) References Cited

U.S. PATENT DOCUMENTS 6,917,078 B2 *  7/2005  Bhattacharyya ............ 257/347
7,851,827 B2 * 12/2010  Bhattacharyya ............ 257/239

OTHER PUBLICATIONS

Fourches et al.; "Fast neutron irradiation of Monolithic Active Pixel Sensors dedicated to particle detection"; Nuclear Instruments and Methods in Physics Research A 576; Feb. 6, 2007; pp. 173-177.

Fourches et al.; "The Role of Secondary Defects in the Loss of Energy Resolution of Fast-Neutron-Irradiated HPGe Gamma-Ray Detectors"; IEEE Transactions on Nuclear Science, vol. 38., No. 6, Dec. 1991; pp. 1728-1735.
Richter et al., "Design and technology of DEPFET pixel sensors for linear collider applications"; Nuclear Instruments and Methods in Physics Research A 511; 2003, pp. 250-256.
Benton et al., "Evolution from point to extended defects in ion implanted silicon", J.Appl.Phys. 82 (1), Jul. 1, 1997, pp. 120-125.
Brusa et al., "Vacancy-hydrogen interaction in H-implanted Si studied by positron annihilation", Physical Review B, vol. 49, No. 11, Mar. 15, 1994-I, pp. 7271-7280.
Pearson et al., "Electrical Properties of Deep Silver—and Iron-Related Centres in Silicon", J. Phys. C: Solid State Phys., 17, 1984, pp. 6701-6710.

* cited by examiner

*Primary Examiner* — Dung A. Le
(74) *Attorney, Agent, or Firm* — Pillsbury Winthrop Shaw Pittman LLP

(57) ABSTRACT

A semiconductor device includes an active zone doped according to a first type; a drain zone formed in the active zone and doped according to a second type; a source zone formed in the active zone and doped according to the second type; an insulated gate zone separated from the active zone by an insulating layer; a deep well, doped according to the second type such that the active zone is located between the gate zone and the well; a floating gate zone formed in the active zone under a space existing between the drain zone and the source zone, the floating gate zone including defects introducing deep levels in the bandgap of the semiconductor material, the deep levels being suited to trap carriers corresponding to the first type such that a charge state of the floating gate zone is modified and a drain source current varies due to the presence of a supplementary potential on the floating gate zone, a concentration of defects in the floating gate zone being strictly greater than $10^{18}$ cm$^{-3}$.

27 Claims, 2 Drawing Sheets

SEMICONDUCTOR DEVICE

The present invention concerns a semiconductor device. The semiconductor device according to the invention has a particularly interesting application in the field of semiconductor detectors for the detection of light or of charged particles.

Numerous types of semiconductor detectors or sensors have been proposed for the means of detecting light or particles. The present invention forms part of the family of photodetectors. These photodetectors in the fields of visible, infrared or high energies, whether at low or high reading speeds, are based on the generation of carriers by the light or the incident particles, which interact with an output device or a circuitry to produce an electrical signal.

A first type of known device, termed a charged coupled device (CCD), consists of a set of MOS capacitors (metal oxide semiconductor) realized on the same wafer and the gates of which are very close to each other. The operating principle is as follows: to create under one of the gates a potential well in which the minority carriers created by the incident light or the charged particles will be trapped, then by ad hoc bias of the adjacent gate, to transfer the packet of charges under the latter.

However, certain difficulties arise in such a technology. Thus, because of the charge transfer from one gate to the other up to the output of the device, the charges move through numerous gates. On arrival, a portion of the charges will be definitively lost.

A known solution to this problem consists in using a second type of detection device, terms an active pixel sensor (APS). Contrary to the CCD devices, the APS devices do not operate by charge transfer. As the APS do not have a charge transfer to be carried out towards an output, it will be easily understood that the previously described shortcomings of the CCD are eliminated. The principle of the APS consists in associating, in each pixel, a photosensitive detector (photodiode, photoMOS, . . . ) and an amplification circuit to a low impedance output and through an addressable bus. The latter will switch the amplified signal resulting from the integrated photoelectric charges towards an output through an addressable column bus. This principle therefore makes the numerous transfers of charges from pixel to pixel of the CCD pickups no longer necessary. It will be noted that the APS (active pixel sensors) are particularly efficient as detector of light and imaging devices, but have likewise been proposed and tested for the detection of charged particles.

However, the technology of the APS likewise poses a certain number of difficulties.

In fact, an internal amplification (by avalanche, for example) or external amplification is required. A certain number of technologies have been proposed to fulfil these functions. The oldest is the photodiode, which can be used in totally deserted mode or in photovoltaic mode. The photodiode can be constituted by a simple pn junction (asymmetrical, with heterostructure or simply homostructure), a Schottky contact (semiconductor metal) or else a pin structure which is very often used in detectors for physics.

It is therefore established that the APS technology assumes supplementary devices to carry out the amplification.

A known solution allowing the above-mentioned problem to be overcome consists in using a structure known as DEPFET ("depleted p-channel field effect transistor"), which forms a structure which is both detecting and amplifying. An example of such a structure is described in the article "Design and technology of DEPFET pixel sensors for linear collider applications" (Nuclear Instruments and Methods in Physics Research A 511 (2003) 250-256—Richter et al.). The p-channel DEPFET structure is a FET transistor with a channel desertion which uses a deep floating gate constituted by a n+ doped well. A DEPFET furthermore comprises a lower p+ doped contact. A photon or a charged particle creates, by interacting with the detector, electron-hole pairs. The DEPFET operations on the basis of a collection of the electrons generated on the internal n+ well. These electrons are generated in the deserted zone situated under the internal well which can extend up to 300 µm in the semiconductor material of the active zone. This deserted region is realized by applying a high and negative electrical tension to the lower p+ contact. Consequently, the n+ well attracts the electrons in the lower depleted zone and localises them such that the DEPFET allows the drain source current to be modulated by the electrons collected by this internal control well.

However, the implementation of a DEPFET structure likewise poses certain difficulties.

Thus, the lower p+ contact of the DEPFET requires an additional bias (i.e. other than the bias of the transistor) with a high voltage so as to obtain a sufficient signal.

In addition, as we have mentioned above, the electrons permitting the modulation of current are situated in a deserted zone located under the internal gate: this zone can extend up to 300 µm in the semiconductor material of the active zone. This dimension of several hundreds of µm in fact entails a large thickness of the device, the thickness having a direct impact on the dimension of the detector pixel.

Finally, the technology of the DEPFET is difficulty compatible with an existing MOS technology, because it necessitates the use of a detector grade semi-insulating silicon substrate.

In this context, the present invention aims to provide a semiconductor device which is particularly suited to the detection of light or of charged particles, the said device allowing detectors to be obtained which have smaller dimensions than the known detectors, functioning with or without additional bias and being compatible with an existing MOS technology.

To this end, the invention proposes a semiconductor device, in particular in a semiconductor detector, comprising:
  an active zone of semiconductor material doped according to a first type of doping;
  a drain zone formed in the said active zone and doped according to a second type of doping;
  a source zone formed in the said active zone and doped according to the said second type of doping;
  a gate zone separated from the said active zone by an insulating layer;
  a deep well, doped according to the said second type of doping such that the said active zone is located between the said gate zone and the said well;
the said device being characterized in that it comprises a floating gate zone formed in the said active zone under the space existing between the said drain zone and the said source zone, the said floating gate zone comprising defects introducing deep levels in the bandgap of the said semiconductor material, the said deep levels being suited to trap carriers corresponding to the said first type of doping such that the charge state of the said floating gate zone is modified and the drain source current varies due to the presence of the supplementary potential on the said floating gate zone, the concentration of defects in the said floating gate zone being strictly greater than $10^{18}$ cm$^{-3}$.

A concentration of defects in the floating gate zone strictly greater than $10^{18}$ cm$^{-3}$ allows a migration length of the carriers corresponding to the first type of doping to be obtained less than 1 μm and preferably comprised in the range of [0.1 μm-1 μm].

Defects introducing deep levels in the bandgap are understood to mean defects which are not used as dopants, donors or acceptors, of the semiconductor material: in other words, they are defects introducing ionisation levels closer to the centre of the bandgap (i.e. permitted levels of the bandgap with high activation energy). These can be impurities (for example copper, iron, cobalt or gold in the silicon) or structural defects (typically vacancies introducing levels close to the centre of the bandgap).

The device according to the invention has a structure identical to that of an insulated gate enhancement MOSFET transistor and further comprises a floating gate zone which traps carriers, this being based on the properties of deep levels due to defects or impurities in a crystalline semiconductor. To make such a zone, a sufficiently high concentration of deep traps is needed, the value of $10^{18}$ cm$^{-3}$ forming the lower limit below which the concentration should not fall in order to maintain a sufficiently high trapping effect.

According to the invention, in the detector mode of operation for either charged particles or light, photon or charged particles create electron-hole pairs by interacting with the semi-conductor device in the whole active zone located beneath the insulating layer.

Starting from the hypothesis that the first type of doping is a p doping and the second type is a n doping, the holes generated along the track of the particle (or generated by the photon) near the n-type well and in the upper active zone are trapped in the deep floating gate zone, whilst the electrons migrate from the bulk of the semiconductor and add to the drain-source current. To ensure the balance of the currents, holes are injected and trapped on the deep trapping gate, thus increasing its efficiency by rising its positive charge. The functioning of the device according to the invention is therefore based on the charge state of the deep trapping gate zone which traps the holes originating from the generation of electron hole pairs by the light or the incident charged particle for a sufficient duration (typically several μs). The fact that this gate is buried (although floating) in the active zone of type p entails that the variations of the potential of this trapping gate are reduced, which allows the functioning of the device. The operating principle of the trapping gate zone is to reduce the migration length of the carriers by trapping and retention, which entails a modification of the charge state of the trapping gate and ensures the modulation of the current in the channel (inversion layer N in the immediate vicinity of the insulating gate layer) of the device forming a MOSFET with enrichment insulated gate. Contrary to the devices of the DEPFET type, which are based on a channel depletion FET transistor with a buried gate trapping the same type of carriers (the electrons) as those forming the drain source current, the trapping gate of the device according to the invention will attract the holes, the electrons being the carriers forming the drain source current.

The presence of defects in the deep trapping gate entails a reduction in the migration length of the carriers (holes for a n-MOSFET).

Contrary to the DEPFET, the total thickness of the device according to the invention can be typically reduced to a few microns. The active zone which contributes to the detection is comprised between the well and the upper interface active zone/insulating layer: its thickness is in the order of a few microns (typically less than 5 μm). This zone is partially deserted since the device according to the invention can function either without bias on the well or with a moderate bias.

The detrapping of the carriers trapped on the gate takes place with a time constant which is much greater than the trapping. This has as a result a detected signal comprising a relatively short rise time and a slow fall time (up to a few microseconds at temperature T=27° C.). This signal fall constitutes a natural return to zero and its duration depends on the rate of emission of the carriers of the deep traps.

As we have mentioned, the device can function as a detector of light (or of charged particles); in this case, the charge is integrated on the gate up to saturation or up to the equilibrium between trapping and detrapping.

The device according to the invention can likewise function as a volatile memory: typically, in the case of an n-MOS (holes trapped by the trapping gate), holes can be injected (typically via a contact substrate having an ad hoc geometry) and thus a positive charge can be created on the deep trapping gate. The device therefore acts as volatile memory, necessitating refreshing, because the emission of the carriers suppresses the written state in the device. It should be noted on this subject that the devices such as non-volatile memories using charge trapping in a known manner differ fundamentally from the device according to the invention in that the charge trapping is carried out in the core of an insulating material (insulating silicon nitride being, for example, used as trapping material). The trapping gate according to the invention is not dielectrically coupled to the gate electrode via a tunnel dielectric zone.

It should likewise be noted that the traps linked to the deep levels have always been considered as an obstacle to the correct operation of the detectors, rather than a possible operation principle (cf. on this subject the articles: "The role of secondary defects in the loss of energy resolution of fast-neutron-irradiated HPGe Gamma-ray detectors" Fourches et al., IEEE Transactions on Nuclear Science, Volume 38, Issue 6, December 1991 Page(s): 1728-1735 and "Fast neutron irradiation of monolithic active pixel sensors dedicated to particle detection", Fourches et al., 8$^{th}$ International Workshop on Radiation Imaging Detectors, Nuclear Instruments and Methods in Physics Research Section A: Accelerators, Spectrometers, Detectors and Associated Equipment, Volume 576, Issue 1, 11 Jun. 2007, Pages 173-177). The technological difficulties due to the deep traps in a crystalline semiconductor are above all linked to the lack of knowledge concerning their fundamental properties, an aspect which is rapidly progressing particularly for crystalline silicon. This now allows devices to be proposed which use their intrinsic charge trapping properties.

In addition, no device based on this principle was able to be proposed before the advent of submicronic microelectronic processes, for reasons linked to the amounts of charge generated with respect to the parasitic capacitances.

The device according to the invention therefore presents the following advantages:
  reduction to a single device, which has the role of detector and amplifier (in transconductance);
  use of submicronic processes which allow a very high integration density to be obtained;
  the two preceding remarks allow pixels of reduced size to be obtained, which authorises the design of detectors with very small spatial resolution (typically less than 1 μm);
  the reductions in dimensions allow a simplification to be envisaged of the processing of data, hence a simplification of the reading electronics, which can be simply binary, in the case of an application for the detection of ionising particles;

the device according to the invention allows a rapid detector with auto-return to zero, by the simple effect of the thermal emission of the charge carriers, by the deep levels of the semiconductor;

this rapid emission at ambient temperature allows light to be detected continuously with a brief response time (<a few μs).

It will be noted in addition that the device according to the invention is compatible with a CMOS technology, since a complementary device can be manufactured using electron traps on a complementary technology (for which the n doping replaces the p doping and reciprocally). The hole traps then become electron traps.

The semiconductor device according to the invention can likewise have one or several of the characteristics below, considered individually or according to all the technically possible combinations:

the said deep well has the form of a well with a low part and a lateral part, the said lateral part surrounding the said floating gate zone;

the said floating gate zone is close to the said space existing between the said drain zone and the said source zone;

the concentration of defects in the said floating gate zone is greater than or equal to $10^{19}$ cm$^{-3}$;

the concentration of defects in the said floating gate zone is less than or equal to $10^{21}$ cm$^{-3}$;

the concentration of deep defects in the said floating gate zone is substantially equal to $10^{20}$ cm$^{-3}$;

the concentration of deep defects decreases from the said floating gate zone up to the interface between the said active zone and the said insulating layer to reach a concentration less than or equal to $10^{18}$ cm$^{-3}$;

the semiconductor material is crystalline silicon;

the said semiconductor material is amorphous silicon;

the said floating gate zone is situated at a distance comprised between 0.2 μm and 5 μm of the interface between the said active zone and the said insulating layer; in any case, the floating gate zone must be located under the induced channel (or inversion layer) of the device according to the invention;

a first part of the thickness of the said floating gate zone covers the said deep well and the other part of the thickness of the said floating gate zone is situated above the said deep well;

the said floating gate zone is situated for a half of its thickness on the said deep well;

the different zones and the well are formed on a semiconductor substrate or a SOI substrate;

the said first type of doping is a p doping and the said second type of doping is an n doping, such that the trapped carriers in the said floating gate zone are holes;

the device according to the invention comprises at least one contact for the bias of the said deep well;

the said insulated gate zone has a length less than or equal to 0.2 μm;

the said active zone has a width less than or equal to 1 μm;

the said defects introduce deep levels having a capture cross section of the carriers resulting from the said first type of doping greater than $10^{-14}$ cm$^2$;

the activation energy of the deep defects is comprised between 0.3 and 0.5 eV;

the device according to the invention comprises a contact for the injection of carriers corresponding to the said first type of doping in the said active zone.

The present invention likewise has as an object a method for manufacturing a device according to the invention, characterized in that the said floating gate zone is obtained by ion implantation (for example of silicon, germanium, iron or hydrogen in the silicon).

The method according to the invention can likewise have one or more of the characteristics below, considered individually or according to all the technically possible combinations:

the said ion implantation is followed by a thermal annealing;

the said ion implantation is realized using two different implantation energies.

The present invention likewise has as an object a method for manufacturing a device according to the invention characterized in that the said floating gate zone is obtained by epitaxy.

Advantageously, the said zone is subjected to an electronic bombardment or a plasma treatment.

The present invention likewise has as an object a detector comprising a device according to the invention.

The present invention likewise has as an object a volatile memory comprising a device according to the invention.

Other characteristics and advantages of the invention will emerge clearly from the description which is given thereof below, by way of indication and in no way restrictive, with reference to the attached figures, in which:

In all the figures, the common elements bear the same reference numbers.

FIG. 1 represents diagrammatically a semiconductor device 1 according to a first embodiment of the invention.

Figure 1:
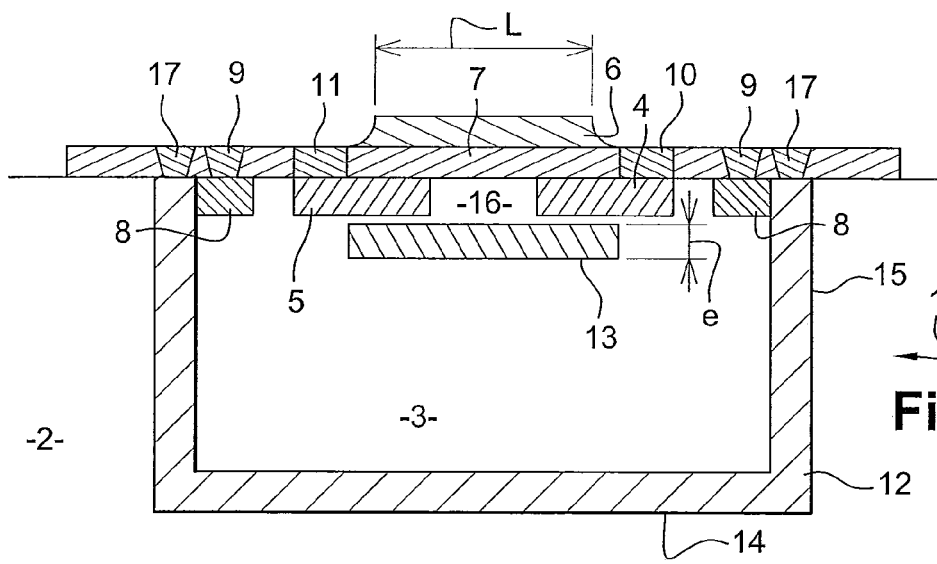
FIG. 1 represents diagrammatically a semiconductor device according to a first embodiment of the invention.

The device 1 is realized from a substrate 2 which can be a solid or epitaxied substrate. The substrate can likewise be an SOI substrate ("Silicon On Insulator"). Typically, the substrate 2 here is a silicon substrate of type p.

The device 1 comprises:

the substrate 2 of type p;

an active p-doped zone 3 integrated to the substrate 3;

a drain zone 4 formed in the active zone 3 and strongly n-doped (i.e. n+ doped);

a source zone 5 formed in the active zone 3 and n+ doped;

an insulated gate zone 6, typically of polysilicon, separated from the active zone 3 by an insulating layer 7 of SiO$_2$ situated in the upper part of the substrate 2;

two strongly p-doped zones 8 (i.e. p+ doped) situated respectively on either side of the drain zone 4 and of the source zone 5;

two metallic contacts 9 situated in the upper part of the substrate 2, ensuring respectively the contact with the two zones p+ 8;

a metallic contact 10 of drain zone 4 situated in the upper part of the substrate 2;

a metallic contact 11 of source zone 5 situated in the upper part of the substrate 2;

a deep well 12 in the substrate 2 and n-doped;

a floating gate zone 13 formed in the active zone 3 (we will designate this floating gate zone 13 by the term trapping gate 13 or "deep trapping gate" in the remainder of the description).

The deep well n 12 comprises a lower horizontal part 14 and a lateral part 15; the lateral part 15 delimits the active part 3 and therefore surrounds the trapping gate 13. The lateral part 15 opens on two metallic contacts 17. The well 12 has, for example, the form of a confinement ring, the lower part 14 of which has a thickness typically less than or equal to approximately 0.2 μm and is situated at a depth varying from 0.5 μm to several μm beneath the layer 7 of gate oxide (typically approximately 1 μm).

The trapping gate 13 is situated beneath the space 16 existing between the drain zone and the source zone in which the n induced channel is formed (or inversion layer) if one carries the gate zone 6 to a positive potential. The trapping gate is positioned very close to the space 16.

The trapping gate 13 is realized from defects or impurities introducing deep levels in the bandgap of the silicon. Defects or impurities introducing deep levels in the bandgap are understood to mean defects which are not used as dopants, donors or acceptors, of the semiconductor material: in other words, they are defects introducing ionisation levels closer to the centre of the bandgap (i.e. permitted levels in the bandgap at high activation energy).

It will be noted that, according to this embodiment, the trapping gate 13 is situated between the space 16 and the low part 14 of the well 12 without covering between the trapping gate 13 and the low part 14.

Figure 4:
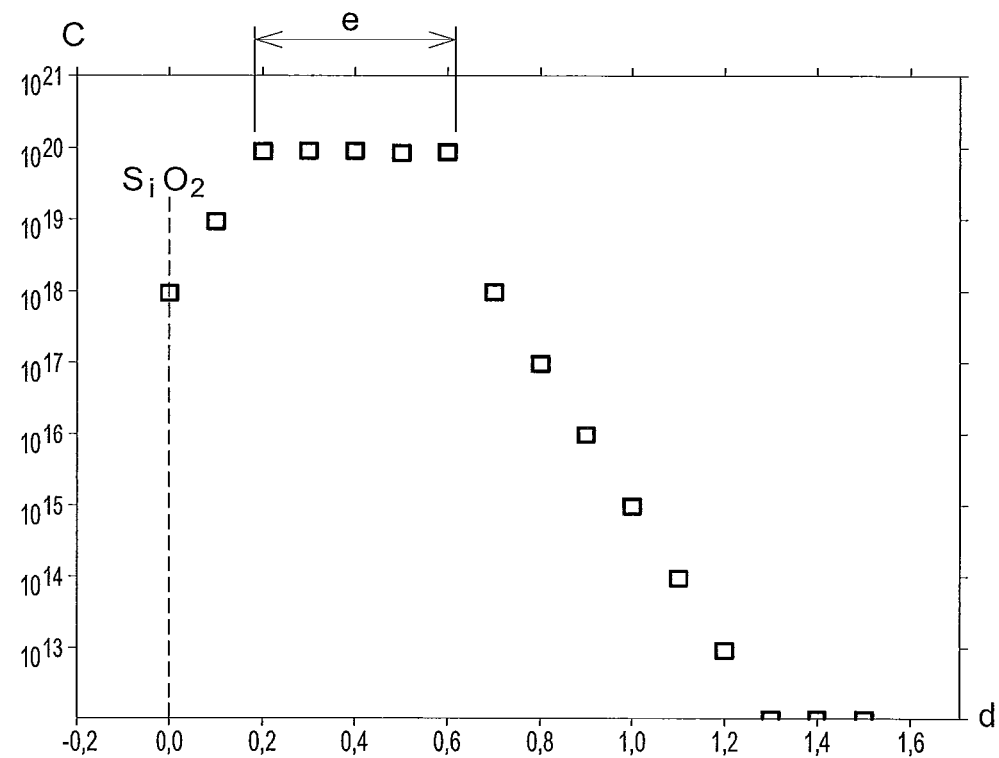
FIG. 4 represents the concentration profile of the defects introducing deep levels in the device according to the invention.

To realize the trapping gate 13, a zone must be obtained having a sufficient concentration of deep levels. The sought profile of concentration of deep levels is represented in FIG. 4. This profile represents the concentration C in $cm^{-3}$ of deep traps as a function of the distance d in μm with respect to the oxide insulating layer 7. This profile comprises a concentration plateau corresponding substantially to the thickness e of the trapping gate 13 (approximately 0.4 μm). It is established that the concentration C reduces very rapidly on either side of the plateau, in particular when one comes close to the insulating layer 7: this reduction is important, because it is advisable not to extend the trapping zone 13 towards the channel zone 16. The trapping zone 13 is situated here approximately 0.2 μm from the insulating layer 7. However, one can envisage a trapping zone slightly further away from the insulating layer 7 (typically up to 2 μm, even 5 μm). The concentration of deep defects in the floating gate zone is substantially equal here to $10^{20}$ $cm^{-3}$ (in any case strictly greater than $10^{18}$ $cm^{-3}$ and preferably greater than or equal to $10^{19}$ $cm^{-3}$) and decreases from the floating gate zone up to the $Si/SiO_2$ interface (active layer/insulating layer interface) to reach a concentration less than or equal to $10^{18}$ $cm^{-3}$ with a thickness of the insulating layer 7 of $SiO2$ varying from 5 nm to 10 nm.

So to obtain such a profile, an ion implantation can be used, either to directly obtain deep defects or to obtain deep impurities. To obtain defects without there being any doping, it is advisable to implant neutral ions (non-doping).

The implantation of deep impurities (for example Fe, Co, W, Au or Cu) in the silicon involves a supplementary technological annealing stage; the degradations of the crystalline network engendered by the implantation in fact drastically reduce the electrical characteristics of the semiconductor and this annealing allows these impurities to be activated electrically. Typically, the creation of deep impurities can be obtained for example by an implantation of Fe in the Si, followed by an annealing (cf. in particular the article "Electrical properties of deep silver and iron related centres in silicon", Pearton et al., J. Phys. C: Solid State Phys., 17 (1984) 6701-6710).

As mentioned above, one can likewise realize the sought profile by creating deep structural defects (for example vacancy like defects) without annealing. More specifically, H+ hydrogen ions can be implanted with adequate energy (typically comprised between 10 keV and 50 keV according to the conditions sought), the concentration of lacunae being able to reach approximately $10^{20}$ $cm^{-3}$ (cf. in particular the article "vacancy-hydrogen interaction in H-implanted Si studied by positron annihilation", Brusa et al., Phys. Rev. B, Vol 49 No. 11, 15 Mar. 1994-I, 7271-7280).

The implantation of silicon at strong doses can also be envisaged (cf. in particular the article "Evolution from point to extended defects in ion implanted silicon", Benton et al., J. Appl. Phys. 82 (1), 1 Jul. 1997, 120-125) just as the implantation of Ge or of another neutral ion.

The obtaining of the profile ad hoc of defect concentrations can likewise necessitate recourse to an implantation from the backside of the substrate, so as to obtain the desired result without annealing; it can also prove useful to work with high implantation energies and a thinned substrate.

An alternative for obtaining the profile ad hoc can consist in using two different implantation energies. A first high energy implantation allows a zone to be created with deep traps and a second lower energy implantation allows the desired concentration (typically $10^{20}$ $cm^{-3}$) to be obtained in the trapping gate zone and to reduce the concentration of deep traps when one comes close to the substrate. The concentration of defects on the surface is thus reduced (primary defects of lacunar nature) by an implantation made with two different energies (high energy to create a zone of deep traps, for example an implantation of Si at an energy greater than 100 keV) and low energy to limit their concentration of deep defects in the active zone above the trapping gate (for example an implantation of Si at an energy in the order of 10 keV).

The realization of the trapping gate zone by implantation therefore involves a stage (sole ion implantation) with two supplementary technological stages (ion implantation and annealing) with respect to a standard realization process of a MOSFET with insulated gate, which stages are entirely compatible with the processes of current technologies.

The device 1 according to the invention is realized from a submicronic technology with a gate length L less than or equal to 0.5 μm. The device 1 according to the invention has a MOSFET transistor structure of linear geometry or closed with insulated gate with n channel enhancement mode comprising a layer 7 of gate oxide of limited thickness (typically less than or equal to 10 nm).

The substrate 2 (epitaxied or non-epitaxied) has a p doping in active zone 3 with a concentration of dopants comprised between $10^{15}$ $cm^{-3}$ and $10^{16}$ $cm^{-3}$.

An implantation beneath the insulating gate layer 7 by means of a suitable dopant can be necessary to control the threshold tension.

The substrate contacts 8 allow the substrate to be grounded (for example via a connection with the source zone 4) to prevent the bias of substrate 2.

The deep n-doped well 12 is located beneath the gate; this type of well is already used in some MOS transistors and is intended to better insulate each transistor from the other devices. Patent document U.S. Pat. No. 5,943,595 (cf. in particular FIGS. 1(a) to 1(c) of this document) describes a method for realizing this type of well 12 by a succession of masking and implantation stages of a doping impurity (followed by an annealing). It is preferable to locate the well 12 close to the upper surface of the substrate 2 (typically at a few μm), which limits the number of primary processes (front-end process).

It will be noted that the zone 13 of trapping gate where deep levels are present is preferably realized after the primary process (front end) of manufacturing and before the realization of the back-end process (metallisation, contacts, passivation, encapsulation).

Other typical orders of magnitude will be found below which are typical for the realization of the device 1 according to the invention (these orders of magnitude are given purely by way of illustration and are not restrictive):

the width of the device 1 is preferably less than 1 μm;
the length of the gate zone 6 is less than or equal to 0.5 μm, without there being an evident lower limit;
the total thickness of the active zone 3 is greater than 8 μm to obtain a sufficient charge and less than the total thickness of the substrate 2;
the concentration of defects in the deep trapping gate 13 is preferably comprised between $10^{19}$ cm$^{-3}$ and $10^{21}$ cm$^{-3}$ and in any case strictly greater than $10^{18}$ cm$^{-3}$. Below this, the trapping in this gate 13 is insufficient. Below the passage to the amorphous state of the surface silicon can alter the operation of the device 1;
the activation energy of the deep defects is preferably comprised between 0.3 and 0.5 eV (for a bandgap width of silicon equal to 1.11 eV) with capture cross sections: $\sigma_p > 10^{14}$ cm$^2$ and $\sigma_n < 10^{-17}$ cm$^2$, in the framework described here, this being so as to obtain suitable return-to-zero times (we will return to this point below with reference to the description of the mode of operation of the device 1. A low activation energy involves a rapid emission, all things being otherwise equal (temperature, capture cross sections). It will be noted that, in the case of a complementary device by inverting the types of doping, i.e. by using electron traps on a complementary technology (for which the material n replaces the material p and vice versa), the hole traps then become electron traps and the capture cross sections are inverted; one therefore has: $\sigma_n > 10^{-14}$ cm$^2$ and $\sigma_p < 10^{-17}$ cm$^2$.

We will describe below the operation of the device 1 in the detector mode of light or of charged particles.

For this, we will start from the hypothesis that the device 1 is biased permanently; in other words, the gate zone 6 is carried at a positive potential with respect to the substrate 2 and the device 1 is supplied with a positive drain source tension. The capacitor constituted by the gate zone 6 and the active zone 3 is charged such that the negative charges (the electrons) appear in the latter in contact with the insulating layer 7 in the zone situated between the drain 4 and the source 5. Thus, in a conventional manner, an inversion n layer is created in the immediate vicinity of the insulating layer 7. This inversion layer (or n induced channel) establishes the conduction between the drain 4 and source 5 zones.

The exposure of the device 1 to a flux of photons or of charged particles will involve the generation of electron-hole pairs in the entire active zone 3.

These electron-hole pairs will be separated: the holes generated along the trace of the particle in the well n 12 and the active zone 3 are trapped in the deep trapping gate 13, whilst the electrons migrate from the mass of the semiconductor towards the channel to flow between the drain zone 4 and the source zone 5.

Figure 2:
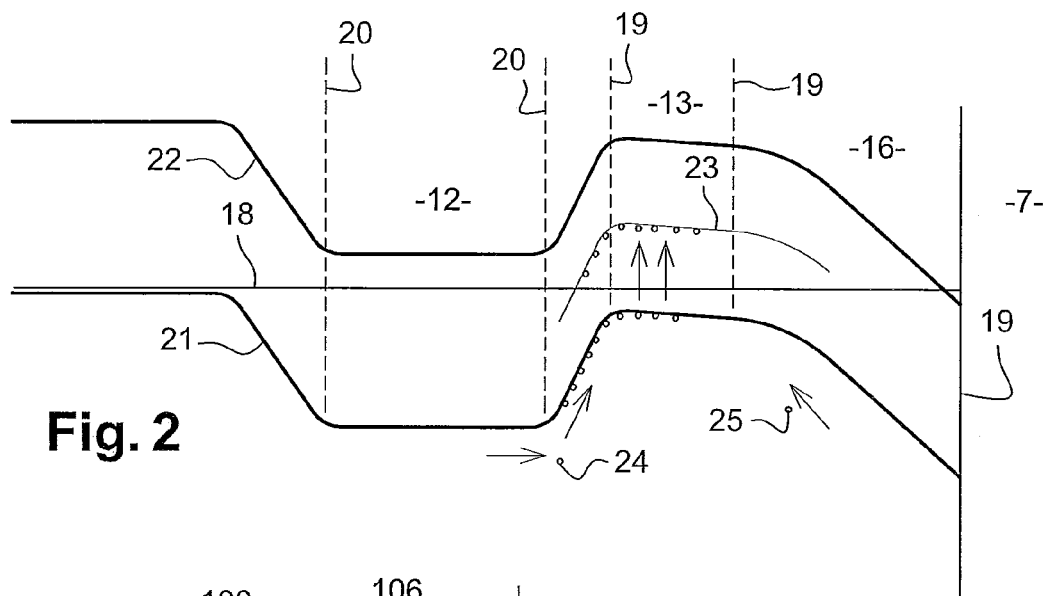
FIG. 2 illustrates a band diagram corresponding to the device according to the invention.

This phenomenon is illustrated by FIG. 2 which represents a band diagram corresponding to the device 1. The horizontal line 18 represents the Fermi level. The vertical line 19 represents the interface between the active zone 3 (and more specifically the drain source zone 16) and the insulating layer 7. The dotted lines 19 substantially delimit the trapping gate zone 13 and the dotted lines 20 substantially delimit the well n 12. The lower outline 21 corresponds to the upper edge of the valence band of the semiconductor. The upper outline 22 corresponds to the lower edge of the conduction band of the semiconductor. A deep hole level 23 is represented in the centre of the bandgap, in the deep trapping gate. It is established that the holes will be trapped in the deep level 23 that they are situated in the well 12 which repel the holes (holes 24 which rise towards the deep level 23) or at the level of the channel 16 (holes 25 which rise towards the deep level 23). The well 12 preferably has the form of a confinement ring (circular lower part 14 and cylindrical lateral part 15) so as to prevent the lateral diffusion of the holes and to cause them to be trapped in the trapping gate 13. The well 12 can be floating or biased at a fixed potential via the contacts 9 so as to increase the efficiency. It is noted here that the device according to the invention can function without additional bias of the well 12.

The trapping gate 13 allows a n+p junction to be created, which creates a deserted zone oriented towards the upper surface and the channel.

Figure 5:
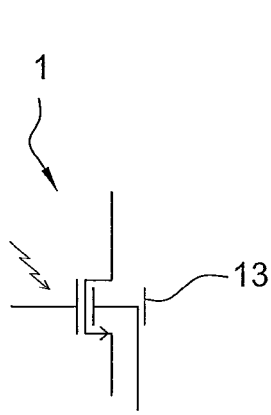
FIG. 5 is a symbolic representation of the device according to the invention.

The trapping of the holes on the trapping gate 13 will increase the positive charge of the trapping gate 13. Consequently, the drain source current is modulated by the charge of the trapping gate 13. The trapping gate 13 can be conceived as a rear gate which modifies the threshold tension of the transistor 1. In this connection, FIG. 5 is a symbolic representation of the device 1 according to the invention, this comprising a deep buried trapping gate 13 illustrated at the rear of the device 1.

As one works initially with a constant gate voltage, the drain source current will vary because of the presence of this supplementary potential on the trapping gate 13.

The deep trapping gate 13 can be characterized by derivatives of usual methods such as EM (Electronic Microscopy), PER (Paramagnetic Electronic Resonance), DLTS (Deep Level Transient Spectroscopy), TCT (Time resolved Current Transients", etc. . . . applicable to the MOS structures.

The return to zero of the device 1 acting as detector is naturally carried out by discharge of the trapping gate 13. The detrapping is carried out with a time constant which is much greater than the trapping. One therefore obtains a detected signal comprising a relatively short rise time and a slow fall time (up to a few microseconds at temperature T=27° C.). This decrease constitutes a natural return to zero and its duration depends on the rate of emission of the carriers of the deep traps. In the case of the device 1 operating as a light detector, the charge is therefore integrated on the trapping gate 13 up to saturation or up to the equilibrium between trapping and detrapping. It is the mode of operation as light detector (or detector of charged particles) for which the drain—source current is the monotonous and continuous function of the illumination (and or of the exposure to charged particles) of the device 1. Slightly n-doped electrodes can likewise be used to inject electrons and to allow a more rapid return to zero. One can likewise inject electrons from the drain zone 4 or from the source zone 5 to recombine the trapped holes and to ensure a reinitialisation of the device 1.

To sum up, the functioning of the device 1 is based on the charge state of the deep trapping gate 13 which traps the holes originating from the generation of electron-hole pairs by the incident light or charged particle during a sufficient duration (several μs). The fact that this gate is buried (although floating) in type p silicon means that the variations in potential of this gate are reduced, which allows the functioning of the device.

Simulations carried out with a software such as TCAD ATLAS® (Silvaco® PISCES, Silvaco® Software Package) allow the validation of the operating principle of the device. The operating principle of the trapping gate is to reduce the migration length of the carriers by trapping and retention, which involves a modification of the charge state of the trapping gate and thus ensuring the modulation of the current in the channel (inversion layer). In particular, the presence of defects in the deep trapping gate involves a reduction in the migration length of the carriers (holes for an n-MOSFET).

For a single deep level of concentration $N_t$, one has a capture length in diffusion $L_p$ given by the formula: $L_p = (D_p \tau_p)^{1/2}$ where $D_p$ is the diffusion constant and $\tau_p$ is the lifetime.

The lifetime $\tau_p$ is given by the formula:

$1/\tau_p = N_t v_{th} \sigma_p$ where Nt is the density of deep levels, with is the thermal velocity and $\sigma_p$ is the capture cross section of hole by the deep levels.

It is therefore established that the diffusion capture length reduces when the product $N_t \sigma_p$ increases.

The drift capture length $L_d$ (when a field is applied) is given by the formula:

$L_d = (N_t \sigma_p)^{-1}$.

It is therefore established that the drift length $L_d$ behaves in the same way as the diffusion capture length and reduces when the product $N_t \sigma_p$ increases.

This means that the concentration of traps must exceed a certain limit to ensure (adequate) functioning of the deep trapping gate. To this effect, as we have previously seen, the concentration of defects in the deep trapping gate 13 is comprised between $10^{19}$ cm$^{-3}$ and $10^{21}$ cm$^{-3}$ and preferably substantially equal to $10^{20}$ cm$^{-3}$.

On the other hand the fact that the device is based on a MOS-FET transistor does not involve any superior principle limitation to the product $N_t \sigma_p$ in the channel of the MOS: (lifetime does not play a major part in the equations of the MOSFETS).

In particular if $N_t = 10^{20}$ cm$^{-3}$ and $\sigma_p = 10^{-13}$ cm$^2$ then $L_d = 0.1$ µm and $1/\tau_p = N_t v_{th} \sigma_p = 10^{14}$ s$^{-1}$, that is $L_p = 0.34$ µm; these lengths correspond to trapping lengths of less than one micron, which is particularly advantageous for a good functioning of the device. Beyond the deep trapping gate, the concentration of deep traps must be limited to ensure an adequate functioning of the device (and in particular to avoid a local amorphisation of the semiconductor). In addition, the simulations show that the functioning is optimum when the trap levels are situated close to the centre of the bandgap.

Figure 3:
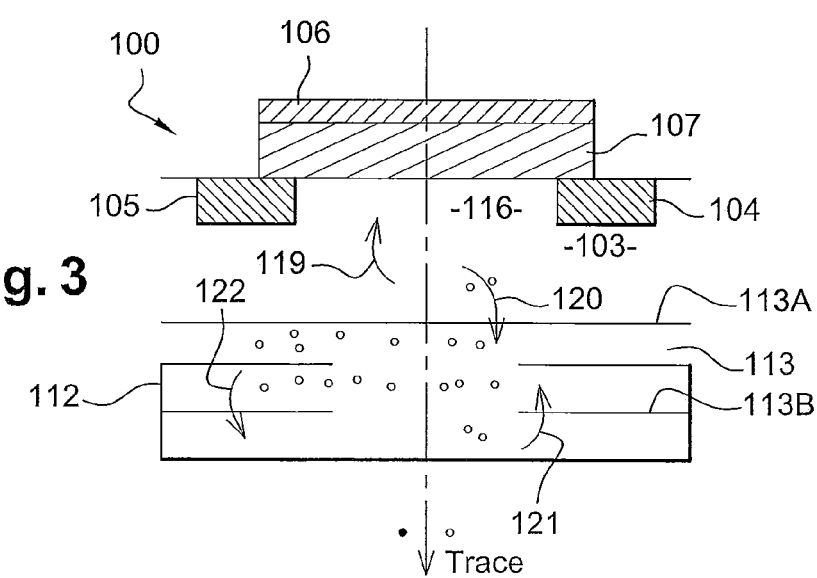
FIG. 3 illustrates diagrammatically a device according to a second embodiment of the invention.

FIG. 3 illustrates diagrammatically a device 100 according to a second embodiment of the invention. This device 100 is more suited to an application of light detection than of charged particles. For simplification, certain elements which are not necessary for an understanding of the device 100 have been omitted.

Just as the device 1 of FIG. 1, the device 100 comprises:
 a p doped active zone 103 integrated with the substrate;
 a drain zone 104 formed in the active zone 103 and n+ doped;
 a source zone 105 formed in the active zone 103 and n+ doped;
 an insulated gate zone 106, typically of polysilicon, separated from the active zone 103 by an insulating layer 107 of SiO$_2$ situated in the upper part of the substrate;
 a deep n well 112 in the substrate and n doped;
 a trapping floating gate zone 113 formed in the active zone 103.

Unlike the device 1 of FIG. 1, the deep trapping gate 113 is situated for half of its thickness (part 113B) on the well n 112 and for the other half on the zone p 103 situated in the upper part. It is situated in the centre of the transition zone n/p.

The device 1 of FIG. 1 is more suited to an application for the trace detection of charged particles for which the thickness of the active zone 3 must be increased (and hence distancing the well 12 whilst possibly biasing the latter via the contacts 17 to realize a potential gradient) so as to increase the sensitivity of the device 1; this distancing of the well is less useful in the case of a photon detector such as the device 100, and one can place the well n very close to the trapping gate p: in the case of the device 100 of FIG. 3, the well 112 is superposed up to the half of its thickness to the trapping gate 113. The bias of the well 113 is likewise less useful and it is therefore not necessary to provide contacts such as the contacts 17 represented in FIG. 1 to bias the well.

It will be noted that in all the cases (device 1 or 100), the trapping gate 13 or 113 must be very close to the channel 16 or 116.

It is likewise desirable that the trapping gate 113 is surrounded by lateral parts (not shown) extending laterally the well 112 and allowing a better confinement of the holes to be realized.

Concerning the operation of the device 100, it is identical to the functioning of the device 1. The arrow represents the track of the photons.

The exposure of the device 100 to the photons will involve the generation of electron-hole pairs in the entire active zone 103.

These electron-hole pairs will be separated: the holes generated along the track of the particle in the well n 112 (cf. arrow 121) and in the active zone 103 (arrow 120) are trapped in the deep trapping gate 13, whilst the electrons generated in the active zone 103 (arrow 119) migrate from the mass of the semiconductor towards the channel 116 to flow between the drain zone 104 and the source zone 105. The electrons generated at the level of the well n 112 (arrow 122) remain confined on the latter; it will be noted that when the well is biased positively with respect to ground, the electrons generated at the level of the well flow towards the positively biased electrode provided for this purpose.

So as to provide some figures allowing the general principles to be fixed, it can be considered that the total number of deep charged traps in the trapping gate is in the order of 1000, this is reasonable taking into account the concentrations of traps and the dimensions of the transistor (1 µm in width and 0.2 µm in length of gate). Thus, with capacitance $C_{OX}$ (gate/gate oxide/silicon capacitance) approximately equal to $1.06 \times 10^{-12} \times 0.2 \times 10^{-8}/5 10^{-7}$ F that is $4.24 \times 10^{-15}$ F for a gate thickness of 5 nm and a capacity $C_{Si}$ (channel/trapping gate capacity) approximately equal to $1.06 \times 10^{-12} \times 0.2 \times 10^{-8}/10^{-5}$ F for a trapping gate situated at 0.1 µm from the channel, that is $2.1 \times 10^{-16}$ F, one can obtain a charge on the trapping gate $\Delta Q_{Si}$ equal to 1000 electrons. This induces an identical image charge on the control gate: the variation in threshold tension is therefore $\Delta V_{th} = \Delta Q_{Si}/C_{Ox}$ approximately equal to 0.038 V. This indicates that a charged trap zone is sufficient to change significantly the threshold tension of the device and consequently to modulate the drain-source current.

$\Delta Q_{Si}$ must be sufficiently large for the device to function: this implies that the generated charge must be greater than a minimum value, which gives a lower limit to the thickness of the device (total thickness of the active zone in the described embodiment is greater than 8 µm); this also gives a lower limit to the density of defects in the deep trapping gate (typically the density must be strictly greater than $10^{18}$ cm$^{-3}$), all things being otherwise equal.

$C_{Ox}$ must be sufficiently small for the device to function; this fixes an upper limit to the geometric dimensions of the device (typically a gate length less than 0.5 µm and a width of device less than 1 µm), all things being otherwise equal.

The device can, however, be reduced by a scale factor n without this affecting the ratio $\Delta Q_{Si}/C_{Ox}$, because if $\Delta Q_{Si}$ passes to $\Delta Q_{Si}/n$ then $C_{Ox}$ passes to $C_{Ox}/n$, thus leaving the ratio $\Delta Q_{Si}/C_{Ox}$ unchanged.

Figure 6:
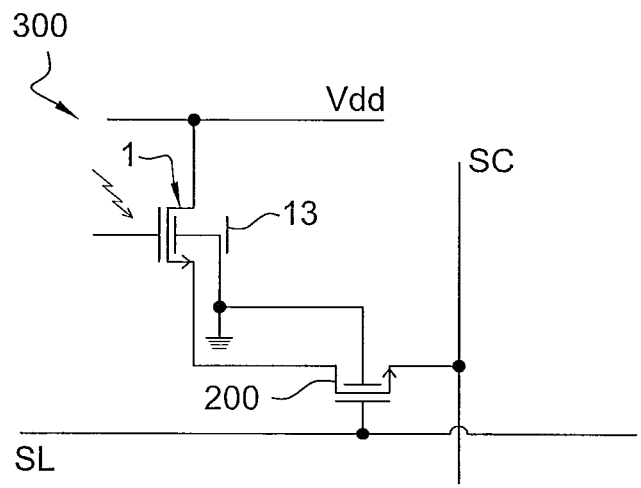
FIG. 6 illustrates diagrammatically an image detector element comprising a device according to the invention.

FIG. 6 illustrates diagrammatically an image detector element 300 comprising a device 1 according to the invention. This element 300 forms a detection point (pixel) belonging typically to a matrix (imager) formed of a plurality of lines and column. The element 300 further comprises a supplementary standard n-MOS transistor 200.

The substrates of the device 1 and of the element 300 are grounded.

The source of the device 1 according to the invention is connected to the drain of the transistor 200.

The drain of the device 1 is connected to a positive tension source Vdd.

The gate of the device 1 is carried at a positive potential with respect to ground.

The gate of the transistor 200 is connected to a selection line SL.

The source of the transistor 200 is connected to an output column SC.

When the transistor 200 is made conducting via the selection line SL which biases its gate, the device 1 functions as a detector with a drain source current capable of being modulated by an exposure of the device 1 to a photon source. The modulated drain source current of the device 1 is recovered at the level of the output column 1.

Of course, the device and the method according to the invention are not limited to the embodiments which have just been described by way of indication and in no way in a restrictive manner with reference to FIGS. 1 to 6.

In particular, even if the described obtaining mode of the trapping gate deals with an ion implantation method, it is likewise possible to create the trapping gate with deep levels by other methods. Thus, successive epitaxies can be used to realize doped layers such that one obtains a lower epitaxied zone p (under the well), the deep n well, the trapping gate doped with ions giving rise to adequate deep levels (preferably trapping holes in the case of an n channel MOS). The deep trapping gate can likewise be realized by electronic bombardment at a given energy, and a given dose, with addition or not of epitaxied layers. Likewise, plasmas of ions or of electrons can be used in the method for production of the deep trapping gate, combined with the epitaxy described above.

In addition, a complementary device can be manufactured by inverting the types of doping, i.e. by using electron traps on a complementary technology (for which the material n replaces the material p and vice versa). The hole traps then become electron traps.

Furthermore, even if the invention has been more particularly described in the case of a solid substrate of silicon, it is likewise possible to use a substrate of the SOI type ("Silicon On Insulator").

Likewise, the invention has been more specifically described in the case of use of a crystalline semiconductor, but one can also consider using amorphous silicon: a simulation made by using passivated hydrogenized amorphous silicon a-Si:H has thus shown that the device according to the invention continues to function.

Finally, even if the device according to the invention has a particularly interesting application in the case of the detection of photons or of charged particles, it should nevertheless be noted that this device can likewise be used as a volatile memory. Thus, by providing a contact for the injection of carriers corresponding to the first type of doping in the active zone (the holes in the embodiment described above), it would be possible to inject carriers of the first type (i.e. holes according to the embodiment described above) towards the trapping gate. One can therefore create a positive charge on the deep trapping gate. The device therefore acts as volatile memory. The injection of holes in the device 1 represented in FIG. 1 can typically be obtained via one of the two metallic contacts 9 situated in the upper part of the substrate 2 ensuring respectively the contact with the two zones p+ 8. The refreshing of this memory can be obtained for example via one or more slightly doped electrodes according to the second type (n doping according to the described embodiment) to inject electrons and to allow a return to zero.

The invention claimed is:

1. A semiconductor device comprising:
   an active zone of semiconductor material doped according to a first type of doping;
   a drain zone formed in said active zone and doped according to a second type of doping;
   a source zone formed in said active zone and doped according to said second type of doping;
   an insulated gate zone separated from said active zone by an insulating layer;
   a deep well, doped according to said second type of doping such that said active zone is located between said gate zone and said well;
   a floating gate zone formed in said active zone under a space existing between said drain zone and said source zone, said floating gate zone comprising defects introducing deep levels in the bandgap of said semiconductor material, said deep levels being suited to trap carriers corresponding to said first type of doping such that a charge state of said floating gate zone is modified and a drain source current varies due to the presence of a supplementary potential on said floating gate zone, a concentration of defects in said floating gate zone being strictly greater than $10^{18}$ cm$^{-3}$.

2. The device according to claim 1, wherein said deep well has the form of a well with a low part and a lateral part, said lateral part surrounding said floating gate zone.

3. The device according to claim 1, wherein said floating gate zone is close to said space existing between said drain zone and said source zone.

4. The device according to claim 1, wherein the concentration of defects in said floating gate zone is greater than or equal to $10^{19}$ cm$^{-3}$.

5. The device according to claim 1, wherein the concentration of defects in said floating gate zone is less than or equal to $10^{21}$ cm$^{-3}$.

6. The device according to claim 1, wherein the concentration of deep defects in said floating gate zone is substantially equal to $10^{20}$ cm$^{-3}$.

7. The device according to claim 1, wherein the concentration of deep defects decreases from said floating gate zone up to the interface between said active zone and said insulating layer to reach a concentration lower than or equal to $10^{18}$ cm$^{-3}$.

8. The device according to claim 1, wherein the semiconductor material is crystalline silicon.

9. The device according to claim 1, wherein the semiconductor material is amorphous silicon.

10. The device according to claim 1, wherein said floating gate zone is situated at a distance comprised between 0.2 μm and 5 μm from the interface between said active zone and said insulating layer.

11. The device according to claim 1, wherein a first part of the thickness of said floating gate zone covers said deep well and that the other part of the thickness of said floating gate zone is situated above said deep well.

12. The device according to claim 1, wherein said floating gate zone is situated for half of its thickness on said deep well.

13. The device according to claim 1, wherein the different zones and the well are formed on a semiconductor substrate or a SOI substrate.

14. The device according to claim 1, wherein said first type of doping is a p doping and said second type of doping is an n doping, such that carriers trapped in said floating gate zone are holes.

15. The device according to claim 1, comprising at least one contact configured to bias said deep well.

16. The device according to claim 1, wherein said insulated gate zone has a length less than or equal to 0.2 μm.

17. The device according to claim 1, wherein said active zone has a width less than or equal to 1 μm.

18. The device according to claim 1, wherein said defects introduce deep levels having a capture cross section of the carriers originating from said first type of doping greater than $10^{-14}$ cm$^2$.

19. The device according to claim 1, wherein the activation energy of the deep defects is comprised between 0.3 and 0.5 eV.

20. The device according to claim 1, comprising a contact for the injection of carriers corresponding to said first type of doping in said active zone.

21. A detector comprising a device according to claim 1.

22. A volatile memory comprising a device according to claim 20.

23. A method for manufacturing a semiconductor device, the method comprising:
   forming an active zone of semiconductor material doped according to a first type of doping;
   forming a drain zone in said active zone and doped according to a second type of doping;
   forming a source zone in said active zone and doped according to said second type of doping;
   forming an insulated gate zone separated from said active zone by an insulating layer;
   forming a deep well, doped according to said second type of doping such that said active zone is located between said gate zone and said well; and
   forming a floating gate zone in said active zone under a space existing between said drain zone and said source zone, said floating gate zone comprising defects introducing deep levels in the bandgap of said semiconductor material, said deep levels being suited to trap carriers corresponding to said first type of doping such that a charge state of said floating gate zone is modified and a drain source current varies due to the presence of a supplementary potential on said floating gate zone, a concentration of defects in said floating gate zone being strictly greater than $10^{18}$ cm$^{-3}$,
   wherein said floating gate zone is obtained by ion implantation.

24. The method according to claim 23, wherein said ion implantation is followed by a thermal annealing.

25. The method according to claim 23, wherein said ion implantation is realized using two different implantation energies.

26. The method according to claim 23, wherein said floating gate zone is obtained by epitaxy.

27. The method according to claim 23, wherein said zone is subjected to an electronic bombardment or a plasma treatment.

* * * * *